United States Patent [19]

Klabunde

[11] Patent Number: 4,877,647

[45] Date of Patent: Oct. 31, 1989

[54] METHOD OF COATING SUBSTRATES WITH SOLVATED CLUSTERS OF METAL PARTICLES

[75] Inventor: Kenneth J. Klabunde, Manhattan, Kans.

[73] Assignee: Kansas State University Research Foundation, Manhattan, Kans.

[21] Appl. No.: 189,221

[22] Filed: May 2, 1988

Related U.S. Application Data

[63] Continuation-in-part of Ser. No. 20,581, Mar. 2, 1987, abandoned, which is a continuation-in-part of Ser. No. 853,027, Apr. 17, 1986, abandoned.

[51] Int. Cl.$^4$ ................................................. B05D 5/12
[52] U.S. Cl. .................................. 427/123; 427/125; 252/309; 106/1.18
[58] Field of Search ................ 427/123, 125; 252/309; 106/1.18

[56] References Cited

U.S. PATENT DOCUMENTS

| | | |
|---|---|---|
| 3,560,409 | 2/1971 | Hartzler . |
| 3,814,696 | 6/1974 | Verdone et al. . |
| 3,867,296 | 2/1975 | Hunt . |
| 4,102,703 | 7/1978 | Tully . |
| 4,599,184 | 7/1986 | Nakatami . |

FOREIGN PATENT DOCUMENTS 1154442  2/1961  Fed. Rep. of Germany .

OTHER PUBLICATIONS

J. Org. Chem. 1982, 47, 843–848 Matsuo.
Bull. Chem. Soc. Jpn. 56, 3578–3584 (1983 Kimura).
Journal of Molecular Catalysis, 21 (1983) 57–79 Klabunde.
Kimura, et al., Bull. Chem. Soc. Jphn. (1983), 56:3578–3584.
Kimura, Bull. Chem. Soc. Jpn. (1984), 57:1683–1684.
Wada, et al., Japn. J. Appl. Phys. (1976), 15:755–756.
Klabunde Accounts of Chemical Research (1975), 8(12):393–399.
Klabunde, et al., J. Mol. Catal., (1983), 21:57–59.
Klabunde, et al., J. Org. Chem. (1979), 44:3901–3908.
Matsuo, et al., J. Org. Chem. (1982), 47:843–848.
Yatsuya, et al., J. Appl. Physics (1973), 12:1675–1684.
Davis, Severson and Klabunde, J. Am. Chem. Soc. (1981) 103:302.
Murdock and Klabunde, J. Org. Chem. (1976), 41:1076.
Klabunde, et al., J. Organometallic Chem. (1974), 71:309.
Davis & Klabunde, J. Am. Chem. Soc. (1978) 100, 5973.
Klabunde, et al., J. Cataly. (1978), 54:254–268.

*Primary Examiner*—Sam Silverberg
*Attorney, Agent, or Firm*—Tilton, Fallon, Lungmus & Chestnut

[57] ABSTRACT

Continuous metal coatings are deposited on substrates from stable solvent dispersions of solvated clusters of metal particles by evaporating solvent from the dispersions. The coatings consist of organic solvent-solvated colloidal metal particles, which provide continuous, electrically-conductive layers.

12 Claims, No Drawings

METHOD OF COATING SUBSTRATES WITH SOLVATED CLUSTERS OF METAL PARTICLES

GRANT REFERENCE

Research relating to the present invention was supported in part by The National Science Foundation under Grant No. CHE-8505906 and The Office of Naval Research under Grant No. N00014-4-85-K-0821. The Government has rights therein.

RELATED APPLICATIONS

This application is a continuation-in-part of co-pending application Ser. No. 20,581, filed Mar. 2, 1987 now abandoned, which was a continuation-in-part of application Ser. No. 853,027,filed April 17, 1986.

FIELD OF INVENTION

The field of this invention is coatings formed from colloidal metal dispersions such as gold sols; and more particularly, deposited metal coatings which are continuous electrically conductive layers.

BACKGROUND OF INVENTION

Colloidal gold in aqueous solution (gold sols) is well-known. A reasonably good understanding of these sols exists, and they have found uses in ceramics, medicine, and other areas. Gold sols are usually prepared by reduction of halide salts, such as $HAuCl_4$. The gold particles and the by-products of the reduction remain in the aqueous solution The colloidal particles are stabilized because of the charged double layer which is dependent on adsorbed anions, usually chloride, that remain in solution after the reduction process. See Jirgensons, B.; Straumanis, M. E., "Colloid Chemistry"; MacMillan: New York, 1962: pp. 119, 130, 258, 306.

Faraday published the first scientific investigations of gold sols. *Phil. Trans.* (1857) 147, 145. He usually reduced aqueous solutions of $AuCl_3$ with phosphorous. However, he also experimented with sparking gold wires. He concluded that gold was present in the solutions as elemental gold, and that color depended on particle size. He also discovered flocculation by addition of an electrolyte NaC1. Other workers also used sparking of metals under water to produce sols of Pb, Sn, Au, Pt, Bi, Sb, As, Tl, Ag, and Hg. See Mindel, et al., *J. Am. Chem. Soc.* (1943), 65:2112, and refs. cited.

The preparation of colloidal metals in nonaqueous media has received less attention. Kurihara et al., *J. Am. Chem. Soc.* (1983), 105:2574–2579, have reported on gold colloids in water-in-oil emulsions Water-polymer-solvent systems have also been reported: Ledwith, A., *Chem. Ind.* (London) 1956, 1310. Blumencron, W., *Med. Monatsschr.* 1957, 11, 89.

Another approach in preparing and stabilizing metal colloids is by macromolecule adsorption-stabilization. A wide variety of materials has been used including gummy gelatinous liquids, albumin, Icelandic moss, latex, polyvinylpyrrolidone, antibodies, carbowax 20M, polyvinylpyridine, and various polymer-water/oil-water mixtures. These studies clearly indicate that "steric stabilization" of metal colloids is also important (along with electronic stabilization). See Hirtzel, et al., "Colloidal Phenomena: Advanced Topics," Noyes Pubs., N.J., 1985, pp. 88–97.

Methods and apparatus are known for generating atomic metal vapors under high vacuum and capturing the vaporized metal in organic solvents. A prototype apparatus which can be used for this purpose is described in Klabunde, et al. (1979), *Inorg. Synth.* 19:59–86. The Klabunde apparatus may be used for organic chemical reactions with metal vapors: Klabunde (1975), *Accounts of Chemical Research*, 8(12):393–399. The apparatus has also been used to form slurries of solvated metals and to prepare catalysts. See Klabunde and Murdock (1979), *J. Org. Chem.*, 44:3901–3908; Matsuo and Klabunde (1982), *J. Org. Chem.*, 47:843–848; and Klabunde and Tanaka (1983), *J. Mol. Catal.*, 21:57–79. Metal slurries were formed by warming a frozen matrix of solvent and dispersed metal, the metal atoms clustering and forming precipitated solids during warming. For catalyst preparation, precipitation of solvated metal was carried out in the presence of catalyst supports, thereby depositing the metals on the supports. The Klabunde apparatus and methods used therewith have not previously been known to be capable of producing stable colloidal dispersions. On the contrary it was believed, as stated in Klabunde and Tanaka (1983), cited above, at page 59: "Clustering of metal atoms in organic media invariaby leads to metal powders that are pseudoorganometallic in nature".

Kimura and Bandow have reported trying to prepare metal colloids in organic solvents by several methods: *Bull. Chem. Soc. Jpn.* (1983), 56:3578–3584. One procedure referred to as the "gas flow-solution trap method" was reported as achieving stable colloidal dispersions from several metals using ethanol as the suspending solvent. Kimura and Bandow sought to produce their dispersions for the purpose of studying the individual colloidal metal particles. To prepare micrographs of the particles, specimens of their dispersions were dropped onto a "Cu grid coated by colloidal film reinforced by carbon film" (page 3579, col. 2, lines 2–3). They wanted to view and measure the separate particles, as illustrated by the micrographs reproduced in their report. No practical use of colloidal dispersions was indicated.

As far as is known, there is no teaching, or even a suggestion, that continuous metal coatings can be formed from organic solvent dispersions of colloidal metal particles; more direct and successful methods for the preparation of nonaqueous metal sols are recognized as desirable. Especially valuable would be methods that avoid: (1) the metal salt reduction step, and thus prevent contamination by other reagents; (2) electrical discharge methods which decompose organic solvents; and (3) the need for macromolecule stabilization. Such a method would provide pure, non-aqueous metal colloids and should make efficient use of precious metals employed. Such colloids would be valuable technologically in many ways.

SUMMARY OF INVENTION

This invention is based in part on the discovery that stable colloidal dispersions of solvated clusters of metal atoms in a polar organic solvent have the property of forming continuous films when applied to substrate surfaces and the solvent is evaporated therefrom. Such stable dispersions are formed from vaporized metal captured in the solvent. The metal particles are solvated with the organic solvent so that they are non-reactive therewith and remain in stable suspension at ambient room temperatures. A wide variety of metals can be used to prepare these coating-forming dispersions, including transition metals, heavy metals, and noble metals.

For example, a monatomic metal vapor may be formed under high vacuum and contacted with the selected organic solvent at a temperature at which the solvent is essentially non-reactive with the metal atoms. This results in capture and dispersion of the metal atoms in the solvent. Co-deposition of the metal vapor and solvent vapor may be employed, the solvent vapor being rapidly condensed and converted to a frozen state. Alternatively, the metal atoms may be captured in a liquid phase solvent maintained at a low temperature, such as a temperature approaching the freezing point of the solvent. A high ratio of solvent to metal is employed to form highly dilute dispersions of the metal. After capture of the metal atoms, the solvent (frozen or liquid) is gradually warmed at a rate favoring controlled aggregation of metal atoms to metal clusters (particles) with simultaneous solvation of the metal particles until a stable colloidal dispersion is obtained.

As indicated, such dispersions of solvated clusters of metal particles are characterized by depositing the clusters as continuous films or layers, merely by evaporation of solvent and concentration of the dispersions. The clusters of metal particles grow together as they deposit, becoming continuous and electrically conductive layers on a substrate. These properties of the deposited metallic films can be further improved by heating the coatings to drive off residual solvent. When ferromagnetic metals are used metallic coatings having magnetic properties can be formed. The films or coatings of the solvated metal clusters may be formed on plastic substrates for use in electrical, electronic or magnetic applications.

DETAILED DESCRIPTION

The stable colloidal metal dispersions used in this invention can be prepared from a large number of metals, including transition metals, heavy metals, and noble metals. It is believed that the metals employed to form the dispersions may be selected from the metals of atomic numbers 21 to 32, 39 to 50, or 72 to 82. These metals in the order of their atomic numbers are: scandium, titantium, vanadium, chromium, manganese, iron, cobalt, nickel, copper, zinc, gallium, germanium, yttrium, zirconium, niobium, molybdenum, technetium, ruthenium, rhodium, palladium, silver, cadmium, indium, tin, hafnium, tantalum, tungsten, rhenium, osmium, iridium, platinum, gold, mercury, thallium, and lead. Preferred metals include the noble metals, viz. silver, gold, and platinum. Other metals believed to be of particular value for purposes of the present invention are iron, palladium, copper, zinc, cadmium, indium, germanium, tin, and lead. Two or more metals may be used simultaneously. The metals may be vaporized together from an alloy mixture, or separately using individual metals in each of two or more vaporizing crucibles.

The term "solvent" as used herein refers to organic liquids which are commonly referred to as solvents, although for purposes of the present invention, the "solvent" is employed to prepare metal dispersions rather than solutions. For purposes of the present invention, the "solvent" to be used is preferably one which is strongly complexing with the selected metal. In general, polar organic solvents have greater complexing power for metal atoms than non-polar solvents. For example, polar solvents having dielectric constants in the range from 10 to 55 are particularly suitable. Such solvents include ketones and alcohols like acetone, methylethylketone, ethanol, propanol, and the like. Depending on the particular metal and the capacity of the solvent to complex with atoms thereof, many other solvents can be used, including, for example, dimethylformamide, dimethyl sulfoxide, tetrahydrofuran, triethylamine, benzaldehyde, acetaldehyde, etc. Weakly polar solvents such as ethers like diethyl ether are usually not effective, and non-polar hydrocarbon solvents like toluene and pentane are generally too weakly complexing for use in forming the stable colloidal dispersions of this invention. If a stable dispersion is not formed with a solvent of lower dielectric constant, a solvent of higher dielectric constant should be selected.

Known apparatus may be employed for forming the metal vapors and contacting them with the organic solvent under conditions of high vacuum and low temperature. Specifically, the apparatus described by Klabunde et al. (1979), *Inorg. Synth.*, 19: 59–86 can be used. This apparatus can be easily constructed from the published description. The Klabunde apparatus includes a vacuum flask connected to a vacuum pump so that a high vacuum can be maintained. The center of the flask is equipped with a metal vaporizing crucible having an electric resistance heating element. A shower-head type inlet is provided for introducing the solvent and directing it toward the side walls. Externally the flask is provided with a removable jacket or "Dewar" for applying liquid nitrogen cooling to the flask. In operation, the solvent vaporizes on entry and co-condenses on the inner walls of the flask together with the vaporized metal atoms. This condensation and cooling generates a frozen matrix of the metal atoms and solvent which builds up on the walls. Following completion of the vaporization and condensation, cooling of the flask is discontinued and it is permitted to gradually warm to room temperature.

Alternatively, a rotary metal atom reactor can be used, for example, a "Torrovap" sold by Torrovap Industries, Markham, Ontario, Canada. This apparatus includes a reaction vessel which is mounted for rotation, and includes connections for generating a high vacuum therein and for introduction of a liquid or gas. Mounted on a stationary support within the flask is a resistance-heater for vaporizing metal. Externally the flask is provided with removable cooling means, viz. for applying liquid nitrogen cooling, dry ice cooling, etc. In one mode of operation, a liquid organic solvent is placed within the vessel forming a pool in the lower portion. As the vessel rotates the solvent flows around the inside surfaces where it is exposed to the metal vapors. The solvent recollects in the liquid pool in the lower portion of the rotating vessel. In another mode of operation, organic solvent can be continuously fed into the flask during vaporization of the metal, being supplied either as a liquid or gas, and co-condensing in solid form (frozen) on the inner walls of the vessel.

In preparing the colloidal metal dispersions certain operation conditions should be observed. The metal vapor should be generated within a chamber under high vacuum. The pressure should be below $10^{-2}$ Torr, and preferably considerably lower. Pressures below $10^{-4}$ Torr are preferred, such as around $10^{-5}$ to $10^{-6}$ Torr. Under such high vacuum conditions, the metal which is vaporized in discrete atom form can be maintained in that form until it is contacted with and captured by the organic solvent. The organic solvent, which is preferably a strongly polar organic solvent, should be at a temperature at which it is essentially non-reactive with the metal atoms, that is, although the solvent interacts with the metal atoms chemical bonds in the solvent molecules are not broken. When the procedure involves co-condensation of the metal and solvent vapors with immediate freezing of the solvent, chemical reaction with the solvent is effectively prevented. However, freezing of the solvent is not essential. If solvent is maintained in liquid form at temperatures within 5°-50° C. of its freezing point, or preferably within 10° to 25° C. of its freezing point, the metal atom/solvent interaction is also inhibited. If the captured metal atoms are found to react with the solvent at the temperature employed, the temperature of the solvent can be further reduced nearer to, or if needed below its freezing point. Where two or more different metals are to be vaporized, the evacuated chamber may be equipped with a plurality of vaporizing crucibles.

An excess of solvent to metal is essential. The dispersions should contain highly dilute concentrations of the colloidal metal particles requiring the use of high ratios of solvent to metal. On a weight ratio basis, at least from 30 to 1000 parts of solvent per part of metal can be used. Preferably, the ratio of solvent to metal is selected to prepare dispersions of predetermined metal molarities. For example, the metal concentrations may range from as low as 0.001 molar to 0.06 molar, or sometimes up to 0.1 molar. Presently preferred metal concentrations range from 0.02 to 0.09 molar. The optimum ratio of solvent to metal will depend on the particular solvent and metal. If the dispersion as prepared lacks sufficient stability because of too high a concentration of the dispersed metal, the stability can be improved by reducing the molarity, accordingly increasing the ratio of solvent to metal in forming the dispersion. Typically, when the dispersions are concentrated to around 0.09 to 0.1 molar, the dispersed particles become unstable and precipitate at ambient temperatures (viz. 25°-30° C.). The solvated metal clusters tend to precipitate together when the triggering concentration is reacted, leaving a supernatant essentially free of metal. This mechanism is useful in forming coatings.

After capturing the metal atoms in an essentially discrete atomic form, the solvent, which is either frozen or in very cold condition, is permitted to warm gradually to the ambient room temperature (20°-25° C.). Very gradual warming has been found to favor solvation of the metal while minimizing chemical reaction. The maximum permissible rate of warming depends on the particular apparatus, the metal, the solvent, and the conditions of capture. With the Klabunde-type apparatus, it has been found that warming from a liquid nitrogen frozen state at −196° C. to a temperature of 25° C. can be accomplished in 1.5 to 2.5 hours to obtain a stable dispersion. In contrast, going from a liquid nitrogen frozen state to room temperature in 30 minutes or less will usually result in precipitation of the metal.

A suitable warming procedure with the Klabunde apparatus is the following: The connection to the vacuum pump is closed leaving the flask at high vacuum. The liquid nitrogen dewar is removed from the outside of the flask permitting melting by heat transfer from the room. The frozen matrix of solvent and dispersed metal atoms on the inner walls of the flask gradually separates from the walls as heat is transferred from the room, and slides down into the bottom portion of the flask which is equipped with a stirrer. The stirrer is rotated slowly to convert the slush of matrix material into a liquid as the melting proceeds. In this way a stable dispersion is usually obtained in about two hours. It has been found inadvisable to fill the flask with a gas such as nitrogen to promote warming by heat transfer within the flask.

After reaching room temperature the dispersions can be removed and under ambient conditions will remain stable for at least 1 to 2 hours (viz. at 25° C.). Depending on the metal and solvent employed, stabilities at 25° C. of at least 12 to 24 hours can be obtained. Certain dispersions are essentially permanently stable at room temperatures. The solvated metal particles will remain in dispersed condition. Colloidal particle size is not believed to be highly critical providing the solvent has effectively complexed with the metal. Some degree of association and clustering of the metal atoms can occur. In general, the colloidal particles may range in size from 1 to 30 nanometers (nm). Typical sizes which have been observed are in the range from 3 to 10, and sometimes up to 20 nm. The particle size determination will depend on the particular method of observation. Particle size is believed to be most accurately determined by electron microscopy measurements.

It has been found that the solvated clusters of metal particles are charged particles, bearing negative charges as determined by electorphoresis. It is believed, however, that the stability of the dispersions is primarily due to the "solvated" character of the clusters, which shields the reactive metal particles from further reaction or association with each other.

An important property of the solvated metal dispersions for purposes of the present invention is their ability to form metal films on evaporation of the solvent. The dispersion can be applied to the surface of a substrate suitable for receiving a metal coating, such as by spraying or dripping on the surface or by other suitable method for forming a liquid layer of the dispersion on the surface. The solvent may then be permitted to evaporate at room temperature, or an accelerated evaporation can be used. As the solvent evaporates, the metal particles deposit on the surface to be coated and form a film thereon. Further, it appears to be a general property of metal films formed in this manner from the colloidal dispersions of the present invention that the films are electrically conductive. Electrical conductivity can be observed in films as thin as 200 to 300 nm. The resulting films have a reflective metallic appearance.

Room temperature evaporation to remove solvent results in the immediate formation of metal films of the character described. But some residual solvent will remain associated with the metal coating. This is believed to comprise the "solvated" portion. This residual solvent can be removed by subjecting the coating to heating, for example, at temperatures of 100° C. or higher up to 500° C. On completion of the removal of the evaporatable solvent, the continuity and the electrical conductivity of the metal coating will usually be substantially improved. However, the final coating will still contain a small amount of organic solvent and/or solvent fragments, which are entrapped within or chemically bonded to the metal aggregates or particles. The amount of such residual material as measured by carbon content may be below 1% by weight, such as 0.1 to 0.5% carbon, but greater amounts may be present. Before removal of the residual solvent, the coatings will typically contain 1.5 to 2.5% carbon, or more.

The metal selected for the coating may provide magnetic properties. Ferromagnetic metals usable for this purpose include iron, cobalt, and nickel.

The colloidal dispersions of the present invention, their method of preparation, and their use for forming metallic coatings are further illustrated by the following examples.

EXAMPLE I

General Technique

Either a codeposition metal atom (vapor) reactor or a rotating metal atom (vapor) reactor can be employed. See Klabunde et al., *Inorg. Synth.* (1979) 19:59; and Timms, "Techniques of Preparative Cryochemistry" in *Cryochemisty*, editors M. Moskovits and G. Ozin, Wiley Interscience, pg. 61 (1976). Metal is evaporated from a hot crucible or hearth, and the vapor condensed simultaneously with the vapor of organic solvent molecules (in excess) on the cooled inside walls of the reactor. Liquid nitrogen cooling is used so that a frozen matrix of captured metal atoms and solvent collects on the bottom of the reactor. After the codeposition is complete the metal evaporation is stopped and organic solvent inlet is stopped.

The frozen matrix is allowed to slowly warm over a period of about two hours. A gradual warming procedure is critical for obtaining stable dispersions. For example, the warming can be carried out as follows: (a) The vessel is isolated from the vacuum train. (b) The liquid nitrogen Dewar is removed, and empty dewar replaced around vessel. (c) The vessel is allowed to warm in the laboratory environment with the vessel still under residual vacuum. (d) Upon melting of the matrix, slow stirring with a magnetic stirring bar is commenced. (e) Upon reaching room temperature the vessel is filled with pure nitrogen and the colloidal solution is syphoned out by use of vacuum.

By using the slow warming procedure, a colloidal solution of small particles suspended in the excess organic solvent is obtained. The colloidal particles are solvated clusters of metal atoms. For example, gold in acetone yields an indefinitely stable purple suspension/disperion at room temperature. In a typical example 0.3 g. gold and 50 ml acetone were co-condensed. About 70% of the gold evaporated reached the solvation zone and remained as a stable colloidal solution. A variety of polar organic solvents have been employed successfully with gold as listed in Table A.

Particle sizes according to transmission electron microscope (TEM) studies ranged from 10–300 A (1–30 nm). However, measurements according to photon correlation spectroscopy (PCS, a laser light dispersion method) yielded larger particle sizes (190–750 nm). Plasmon absorption spectroscopy (PAS) also yielded larger sizes (65–75 nm). If it is assumed that weak particle agglomeration occurs in solution, these differing values can be reconciled. Thus, PCS would be very sensitive to the presence of larger, weakly bound particles; PAS would be less sensitive since it is a collective effect of a group of atoms affecting photon excitation. However, TEM shows the true smaller size of the primary spherical particles which can weakly interact with each other.

TABLE A

Gold Colloidal Solutions in Organic Solvents

| Solvent | Gold Concentration $(M)^a$ | Matrix Color | Colloidal Solution Color (25° C.) | Particle Size TEM |
|---|---|---|---|---|
| Acetone | 0.038 | orange | purple | 1–30 nm$^b$ |
| Dimethylformamide | 0.014 | red | purple-red | 1–25 nm |
| Dimethyl Sulfoxide | 0.0028 | yellow | purple | — |
| Ethanol | 0.040 | purple-red | dark purple | 1–25 nm |
| Tetrahydrofuran | 0.0078 | red | purple | 1–25 nm |
| Triethylamine | 0.0057 | pink | purple | — |

$^a$For acetone and ethanol, about 1% gold by weight.
$^b$Narrow distribution of particle sizes is possible by adjustment of metal concentration. For example, 0.005 M gives 2–4 nm, 0.015 M gives 5–7 nm, and 0.03 M gives 6–8 nm.

Furthermore, other metals behave similarly. Stable colloidal solutions have been obtained from Pd-acetone, P-dethanol, Zn-acetone, Cd-acetone, Cu-acetone, In-acetone, Sn-acetone, and Pb-acetone.

EXAMPLE II

Film Forming Properties of Colloidal Solutions

The colloidal solutions consist only of metal particles and solvent (and organic fragments of the solvent). No contaminants such as halide ion or other material are present. These colloidal particles are "living colloids" in the sense that particle growth can continue under the proper conditions. Thus, these colloidal solutions yield metallic like films upon removal of solvent by evaporation. Metallic appearing, electrically conductive films are obtained by dripping the metal-organic colloid solution on substrates such as sodium chloride crystals, glass, copper, or carbon coated copper, and allowing the solvent to evaporate. Films have been successfully prepared from Au-acetone, Au-ethanol, Au-dimetnylformamide, Au-dimethylsulfoxide, Au-tetrahydrofuran, Au-triethylamine, Pd-ethanol, Pd-acetone, Ag-acetone, Zn-acetone, Cd-acetone, In-acetone, Sn-acetone, and Pb-acetone.

Conductivities for films formed from Au-acetone, Au-ethanol, Pd-acetone, and Ag-acetone have been measured and are typically within the semiconductor range, viz., similar conductivity to silicon metal. Films formed in this way are conductive, but less so than pure metals. The higher resistivity of the films is due to the incorporation of substantial portions of the organic solvent, which can partially be removed by heating, and resistivity then decreases.

A film was prepared by dripping stable acetone-solvated colloidal gold (Au) dispersion on a glass plate edged with silicone rubber adhesive resin. The acetone was allowed to evaporate, and resistivity was measured by trimming the film to a rectangular shape with the following results: Thickness of film $-4.5$ $\mu$m, resistance $= 46$ $\Omega-$cm$^2$, resistivity $\rho(\Omega.cm) = 1.8 \times ^{-2}$. This can be compared with bulk gold where $\rho - 2.4 \times 10^{-6}(\Omega.cm)$. (CRC Handbook of Chemistry and Physics, 65th Ed., CRC Press, Boca Raton, Fla., 1984–85, pp. F38 and E51). Thus, the gold film from Au-acetone is more than 7000 times less conductive due to the incorporation of organic material. Removal of solvent allows the colloidal particles to grow to a film. However, strongly adsorbed acetone, and perhaps small amounts of acetone fragments or telomers as well, remain in the film affecting its electrical properties.

EXAMPLE III

Behavior of Films Upon Heating

Colloidal solutions of Au-acetone and Pd-acetone were employed for the preparation of films on carbon coated copper grids for TEM studies (prepared by the drip-evaporation method discussed in Example II). Examination by TEM showed intertwined chains of metal particles. Upon heating to 150° C., these chains cross-linked considerably with the evolution of organic material (mainly acetone but also some water, a butene compound, and carbon dioxide). Upon heating to 500° C. more organic material was evolved and the film then appeared smoother and more continuous under the TEM.

The amount of organic material lost on heating is demonstrated by the following carbon and hydrogen analysis for the Pd-acetone system.

| Pd—acetone film | % C | % H |
| --- | --- | --- |
| 25° C. | 1.75 | 0.10 |
| 500° C. | 0.39 | 0.03 |

EXAMPLE IV

Temperature and Light Sensitivity

Samples of acetone-solvated gold colloid were subjected to boiling and freezing. Upon returning to room temperature the colloids remained stable and no flocculation had occurred. These results indicate that steric stabilization (solvation) is a very important mechanism. Charge-stabilized colloids generally flocculate when subjected to such extremes of temperature. Vickery, J. R.: *Dept. Sci. Ind. Res. Report Food Investigation Board*, 1929 (1930), 24; Also see *Chem. Abs.*, 1931, 25, 5820. The initially purple-black acetone-solvated silver (Ag) colloid solutions turned grey and the Ag precipitated as a spongy grey mass upon exposure to room light for 3–4 days. However, in the dark the colloid solutions remained stable indefinitely.

EXAMPLE V

Films on Hot Substrates

Using the drip-evaporation method (Example II), films were prepared by dripping Au-acetone and Pd-acetone onto heated carbon coated copper grids. Temperatures of 25° C. and 160° C. were employed. The 160° C. substrates were rapidly coated due to rapid solvent evaporation. Films with continuous electrical conductivity were obtained.

EXAMPLE VI

Spray Coating

Spraying Au-acetone or Pd-acetone solutions using a high pressure inert propellant yielded very evenly dispersed films on flat glass substrates (similar to spray painting).

EXAMPLE VII

Alloy Colloidal Solutions

Evaporation of Au and Pd from the same crucible, using acetone as solvent, yielded colloidal suspensions of Au-Pd alloys. It was apparent that intimate Au-Pd particles were formed since their electrophoresis properties (rate of migration of colloidal particles to anode in an electrical cell) were different than either Pd-acetone or Au-acetone. These results are summarized below:

| | mm/hour at 12.6 volts |
| --- | --- |
| Au—acetone | 5.0 |
| Pd—acetone | 3.3 |
| Au—Pd—acetone | 10.0 |

The above results indicated another interesting property of these colloidal particles. They possess some negative charge, probably obtained slowly during the warmup procedure from the walls of the reactor vessel. Different electrophoresis values also allow characterization of particles (which appear to be unique for each system).

EXAMPLE VIII

Organic metal colloid preparations were made using a "Torrovap" Rotary Metal Atom Reactor (Model TVP-800) purchased from Torrovap Industries, Markham, Ontario, Canada. One of two evaporation techniques was used to prepare the colloidal suspensions. The first, referred to as the co-condensation technique, is similar in principle to the method used with the Klabunde apparatus, as described above. In this case, metal and organic solvent are simultaneously evaporated and codeposited on the interior walls of the evacuated, rotating, glass reaction vessel. Metal evaporation can be achieved by resistive heating in a crucible, by other means, viz. electron-bombardment, laser heating, inductive heating, etc. Organic solvent is introduced through a length of ⅛" OD stainless steel tubing leading to a heated shower head assembly which serves to vaporize the solvent. The metal and solvent vapor streams are directed at right angles from one another to minimize gas phase collisions/reactions. Condensation of the two components as a frozen, solid matrix is achieved by liquid nitrogen cooling from an external bath. Once the codeposition is complete, the cooling bath is lowered and the frozen matrix is allowed to thaw under vacuum, slowly warming to room temperature. The resulting colloidal solution is removed from the reactor and filtered through celite filter aid to remove large particles. The metal solvent combinations summarized in Table B have yielded stable colloidal dispersions, using co-condensation with the "Torrovap" apparatus.

TABLE B

| Metal | Organic Solvent |
| --- | --- |
| Au | Acetone |
| Au | Undecanone (2- and 6-) |
| Au | Methyl Ethyl Ketone |
| Au | Methyl Methacrylate |
| Pd | Acetone |

The second technique involves metal vapor deposition into an organic liquid under high vacuum. In this case, the bulk of the organic liquid is pooled in the bottom of the reactor at the start of the reaction. A film of this liquid is drawn to the upper, interior surface of the glass reaction vessel by the rotating action of the flask. The vapor pressure of the liquid is maintained below $10^{-3}$ Torr by cooling to an appropriate temperature (above freezing point) using the cooling bath. Metal is vacuum evaporated (as before) in an upward direction where the discrete atoms condense into the liquid organic film and subsequently agglomerate to form colloidal particles. The liquid film is continually renewed during the metal deposition by the rotating action thus causing a gradual buildup of colloidal metal in the bulk liquid. At the completion of the reaction, the resulting suspension is held under vacuum and allowed to warm slowly to room temperature, and then filtered to remove any large particles. Stable colloidal suspensions are obtained.

In an alternative to the second technique, the metal is vaporized under higher vacuum and carried by an inert gas stream (viz. helium or argon) into a pool of cold solvent. When this process is continued for a long enough time, despite the large metal deposition losses in transit to the pool of solvent, dispersions can be obtained from which coatings can be prepared as previously described. This procedure is similar to the "gas flow-solution trap method" used by Kimura and Bandow for studying colloidal metal particles (*Bull. Chem. Soc. Jpn.*, 1983, 56: 3578-3584).

The organic solvent dispersions of metal particles prepared as described in this example, like those prepared by the Klabunde method, are solvated colloidal clusters of metal particles. They are stable at ordinary room temperature, but become unstable when concentrated by evaporation of solvent. As evaporation concentration proceeds, the solvated clusters precipitate and can be deposited on a substrate surface where they will grow together and form a continuous, electrically-conductive layer. Part of the residual solvent can be driven off by heating, but traces of solvent and/or solvent fragments will remain associated with the metal layer. However, the metal layer is otherwise free of contaminants, such as halide ions and non-organic solvent contaminants. The coatings therefore comprise electrically conductive layers which are essentially free of undesirable contaminants, being composed essentially of only the metal with a small amount of the polar solvent or organic fragments thereof.

It will be apparent to those skilled in the metal coating arts that the method of this invention for forming continuous coatings from dispersions of solvated clusters of metal particles will be useful in depositing metal films on a wide variety of objects. Such objects can be fabrics, plastics, metals or ceramics. Tubings can be coated on their interiors, exteriors, or both. In commercial applications of the method, variations in the coating procedures will also be apparent to those skilled in the metal coating arts. Coatings may be produced by immersing the substrate to be coated in the dispersion, followed by evaporation of the solvent. Alternatively, the dispersion may be sprayed onto the substrate, and the solvent evaporated to deposit the coating. Still another alternative is to flow the dispersion over the substrate with slow solvent evaporation. This procedure can be continued until the desired film thickness is obtained.

I claim:

1. The method of forming a continuous metal coating on a substrate, comprising the steps of:

(a) preparing a stable colloidal dispersion of solvated clusters of metal atoms in a polar organic solvent by capturing and complexing vaporized metal in said solvent as a frozen matrix and gradually warming said solvent to room temperature without precipitating the captured metal atoms, said metal being selected from the metals having atomic numbers 21 to 32, 39 to 50, and 71 to 82;

(b) contacting the substrate to be coated with said stable dispersion while evaporating said solvent therefrom, said solvent evaporation causing said dispersion to become unstable with progressive precipitation of solvated metal clusters as the evaporation proceeds, the precipitated solvated metal clusters depositing on said substrate; and (c) continuing said contacting and solvent evaporating until a continuous layer of the solvated metal clusters is formed on the substrate, the continuity of said layer being indicated by its electrical conductivity.

2. The method of claim 1 in which said metal is selected from the group of metals consisting of iron, palladium, copper, zinc, lead, silver, cadmium, indium, germanium, tin, platinum, gold, and mixtures thereof.

3. The method of claim 1 in which said metal is gold.

4. The method of claim 1 in which said organic solvent has a dielectric constant of 10 to 55.

5. The method of claim 1 in which said solvent is selected from the group consisting of ketones and alcohols.

6. The method of claim 1 in which said solvent is selected from the group consisting of acetone and ethanol.

7. The method of claim 1 in which said dispersion is essentially free of contaminants, being composed only of the metal and the organic solvent, and the deposited layer is thereby correspondingly free of contaminants.

8. The method of claim 1 in which said dispersion has a metal concentration of at least 0.02 molar.

9. The method of forming a continuous metal coating on a substrate, comprising the steps of:

(a) preparing a stable colloidal dispersion of solvated clusters of metal atoms in a polar organic solvent by capturing and complexing vaporized metal in said solvent as a frozen matrix and gradually warming said solvent to room temperature without precipitating the captured metal atoms, said metal being selected from the group of metals consisting of iron, palladium, copper, zinc, lead, silver, cadmium, indium, germanium, tin, platinum, gold, and mixtures thereof, said organic solvent having a dielectric constant of 10 to 55;

(b) contacting the substrate to be coated with said stable dispersion while evaporating said solvent therefrom, said solvent evaporation causing said dispersion to become unstable with progressive precipitation of solvated metal clusters as the evaporation proceeds, the precipitated solvated metal clusters depositing on said substrate; and (c) continuing said contacting and solvent evaporating until a continuous layer of the solvated metal clusters is formed on the substrate, the continuity of said layer being indicated by its electrical conductivity.

10. The method of claim 9 in which said solvent is selected from the group consisting of acetone and ethanol.

11. The method of claims 9 or 10 in which said dispersion is essentially free of contaminants, being composed only of the metal and the organic solvent, and the deposited layer is thereby correspondingly free of contaminants.

12. The method of claims 9 or 10 in which said dispersion has a metal concentration of at least 0.02 molar.

* * * * *